United States Patent [19]

Etoh et al.

[11] Patent Number: 4,495,601
[45] Date of Patent: Jan. 22, 1985

[54] MAGNETIC BUBBLE MEMORY APPARATUS

[75] Inventors: Tadaaki Etoh; Ryuji Yano; Kazuhiro Ishida; Shoji Yoshimoto, all of Mobara, Japan

[73] Assignee: Hitachi, Ltd., Tokyo, Japan

[21] Appl. No.: 356,640

[22] Filed: Mar. 10, 1982

[30] Foreign Application Priority Data

Mar. 20, 1981 [JP] Japan .................................. 56-39471

[51] Int. Cl.³ ............................................. G11C 19/08
[52] U.S. Cl. ....................................................... 365/1
[58] Field of Search ................................. 365/1, 2, 53

[56] References Cited

U.S. PATENT DOCUMENTS 4,308,593 12/1981 Young et al. ........................... 365/1

FOREIGN PATENT DOCUMENTS 43427 4/1979 Japan ...................................... 365/2
49822 11/1979 Japan ...................................... 365/2

Primary Examiner—James W. Moffitt
Attorney, Agent, or Firm—Charles E. Pfund

[57] ABSTRACT

In a magnetic bubble memory apparatus of cassette type comprising a magnetic bubble memory device and a signal detector contained in a cassette, the memory device and the signal detector are surrounded by a grounded shield made of electroconductive material.

1 Claim, 4 Drawing Figures

MAGNETIC BUBBLE MEMORY APPARATUS

BACKGROUND OF THE INVENTION

This invention relates to a magnetic bubble memory apparatus and more particularly a sheild structure thereof for preventing external noise.

As shown by a block diagram in FIG. 1, a prior art magnetic bubble memory apparatus is constituted by an interface controller 1 including a bubble memory controller, a timing controller 2, pulse current drive circuits 3, source of power supply 4, signal detector 5 and a magnetic bubble memory device 6 and is connected to a central processing unit 7.

Usually, since the signal taken out from the bubble memory device are very small, for example of the order of several mV, it is necessary to amplify such a small output to a level of several hundred mV and then detect the signal. The detected signal is then sent to a processing unit. During such amplification of several hundreds times, the signal is greatly affected by ambient noise. Accordingly, the magnetic bubble memory device 6 and the signal detector 5 should be used at a place remote from a source of noise.

Specifically, the signal detector 5 has a circuit construction as exemplified in FIG. 2. This circuit is connected to receive a bubble detection output signal of several millivolts from a pair of magnetoresistive detectors. The detection signal is superimposed on a noise generated under the application of a rotating magnetic field. The noise is cancelled by a differential preamplifier IC1 and only the bubble output is taken out. The gain of the preamplifier IC1 is set to about 100 times to amplify the bubble output signal from several millivolts to several of hundreds of millivolts. The thus amplified bubble output signal is fed to a dual sense amplifier IC2, and the presence or absence of the bubble output signal is detected at the timing of a strobe pulse STR-P (from timing controller 2) and converted into a TTL level signal. This signal is then fed to a dual D-type positive edge-triggered flip-flop IC3 and a data latched at the timing of the strobe signal is applied to the interface controller 1. Such a signal detector as described above is very susceptible to ambient noise.

With increased use of the magnetic memory device in recent years, it became necessary to develop a portable magnetic bubble memory apparatus of cassette type capable of being readily exchanged with a recorded memory device. Such a magnetic bubble apparatus is constructed such that the magnetic bubble memory device and the susceptive signal detector are contained in a cassette.

Since the cassette of the magnetic bubble memory apparatus has a small size and is easy to handle, it is often located near a CRT or a keyboard of TTY and it is liable to be influenced by noise created thereby.

SUMMARY OF THE INVENTION

Accordingly, it is an object of this invention to provide a magnetic bubble memory apparatus of cassette type completely shielded against external noise.

According to this invention there is provided a magnetic bubble memory apparatus of cassette type comprising a magentic bubble memory device and a signal detector contained in a cassette, characterized in that there is provided shield means made of electroconductive material for surrounding the cassette.

BRIEF DESCRIPTION OF THE DRAWINGS

In the accompanying drawings.

DESCRIPTION OF THE PREFERRED EMBODIMENT

Figure 1:
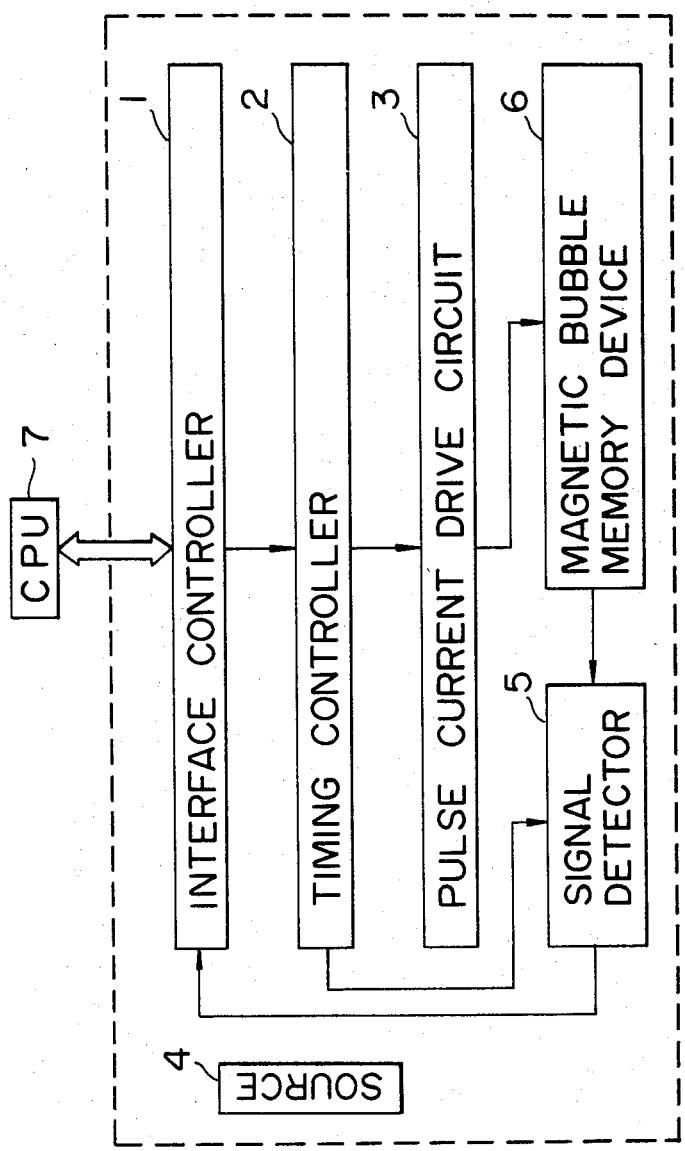
FIG. 1 is a block diagram showing one example of a prior art magnetic bubble memory apparatus.
Figure 2:
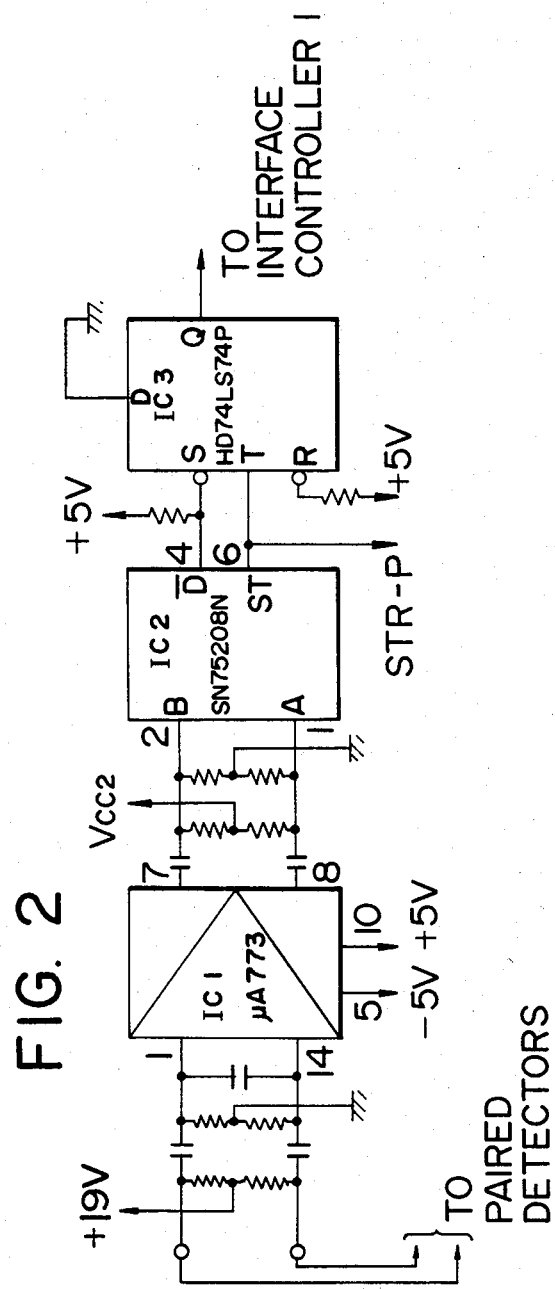
FIG. 2 is an example of a circuit diagram of a signal dectector contained in a cassette.
Figure 3:
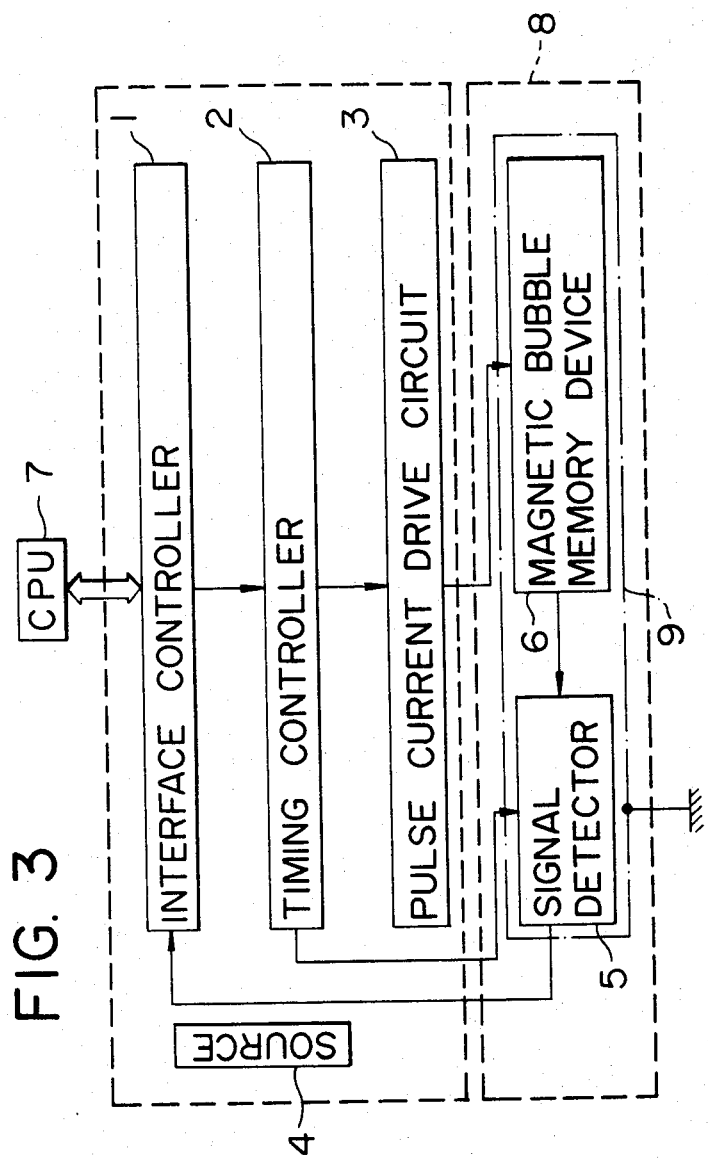
FIG. 3 is a block diagram showing an example of enclosure of the magnetic bubble device and the signal detector in accordance with the invention.

In a block diagram shown in FIG. 3 and showing a preferred embodiment of the magnetic bubble memory apparatus of cassette type of this invention, circuit elements identical to those shown in FIG. 1 are designated by the same reference numerals. In FIG. 3, a cassette 8 is constituted by a signal detector 5 as explained with reference to FIG. 2 and a magnetic bubble memory device 6 including a magnetic bubble memory element, a rotary magnetic field generating coil, a bias magnetic field generating permanent magnet, magnetic flux rectifying plate, etc., not shown. The signal detector 5 and the magnetic bubble memory device 6 are surrounded by a shield 9 made of electroconductive material and the shield 9 is grounded.

Figure 4:
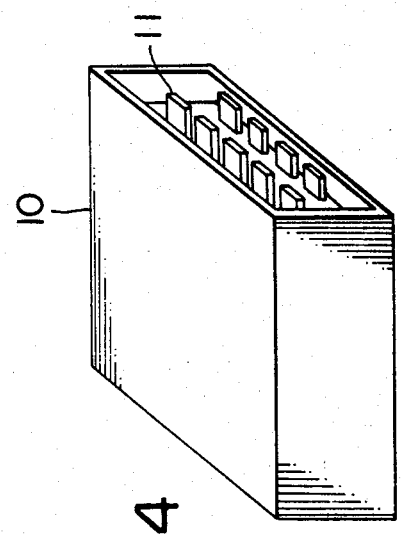
FIG. 4 is a perspective view showing an example of a container acting as a shield.

Practically, as shown in FIG. 4 a container 10 of the cassette is made of electroconductive material, iron plate, for example, to form the shield 9 and the signal detector and the magnetic bubble memory device 6 are contained in the container 10 after mounting them on an insulating substrate, not shown. On one side of the container 10 are provided signal input/output terminals 11.

With this construction, noise (in this specification, the term noise is used to mean electromagnetic waves that cause noise generated by a nearby keyboard, a printer or the like) is efficiently shielded by the shield 9 so that it is possible to increase the antielectrostatic noise level to more than about 200 V from a prior art level of from 50 to 100 V. Grounding of the shield 9 further improves the antielectrostatic noise level.

Although in the foregoing embodiment the cassette of the magnetic bubble memory apparatus contained the magnetic bubble memory device 6 and the signal detector 5, it should be understood that the invention is not limited to this particular construction and that the cassette may contain other components.

Instead of an iron plate, any electroconductive material such as a copper plate, aluminum plate, brass plate, permalloy plate, electroconductive rubber and electroconductive resin can also be used.

As described above, according to this invention, since external noise is effectively shielded, it is possible to obtain a magnetic bubble memory apparatus of cassette type having a high quality and reliability.

What is claimed is:
1. In a magnetic bubble memory apparatus of cassette type comprising a magnetic bubble memory device including a magnetic bubble detector contained in a cassette, the improvement which comprises shield means made of electro-conductive material for surrounding said magnetic bubble memory device, said magnetic bubble detector and a signal detector, said signal detector responds to an electrical signal from said magnetic bubble memory detector to produce an output signal indicative of presence or absence of the magnetic bubble in order to shield external electrostatic noise wherein said shield means comprises a container of the cassette and said shield means is grounded.

* * * * *